(12) United States Patent
Park et al.

(10) Patent No.: US 7,807,318 B2
(45) Date of Patent: Oct. 5, 2010

(54) REFLECTIVE PHOTOMASK AND METHOD OF FABRICATING THE SAME

(75) Inventors: Jin-Hong Park, Seoul (KR); Han-Ku Cho, Seongnam-si (KR); Seong-Sue Kim, Seoul (KR); Sang-Gyun Woo, Yongin-si (KR); Suk-Joo Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 711 days.

(21) Appl. No.: 11/656,466

(22) Filed: Jan. 23, 2007

(65) Prior Publication Data
US 2007/0178393 A1   Aug. 2, 2007

(30) Foreign Application Priority Data
Feb. 2, 2006  (KR) .................. 10-2006-0010196

(51) Int. Cl.
*G03F 1/00* (2006.01)
(52) U.S. Cl. .............. 430/5; 430/311; 430/394
(58) Field of Classification Search .......... 430/311, 430/394, 5
See application file for complete search history.

(56) References Cited

U.S. PATENT DOCUMENTS

| 6,048,652 A * | 4/2000 | Nguyen et al. .......... 430/5 |
|---|---|---|
| 2004/0136075 A1 | 7/2004 | Augustyn et al. |
| 2005/0084768 A1 * | 4/2005 | Han et al. .......... 430/5 |
| 2005/0151095 A1 * | 7/2005 | Sugawara .......... 250/492.2 |
| 2005/0208389 A1 * | 9/2005 | Ishibashi et al. .......... 430/5 |
| 2005/0276988 A1 * | 12/2005 | Trenkler .......... 428/432 |
| 2006/0281017 A1 * | 12/2006 | Kim et al. .......... 430/5 |

FOREIGN PATENT DOCUMENTS

| JP | 2004-289110 | 10/2004 |
|---|---|---|
| KR | 1019930008139 | 8/1993 |
| KR | 10-0335735 | 4/2002 |
| KR | 1020030082819 A | 10/2003 |
| KR | 100604938 B1 | 7/2006 |

OTHER PUBLICATIONS

Korean Notice of Allowance dated May 30, 2007.
Korean Notice of Examination Report dated Nov. 18, 2006.

* cited by examiner

*Primary Examiner*—Mark F Huff
*Assistant Examiner*—Rashid Alam
(74) *Attorney, Agent, or Firm*—Harness, Dickey & Pierce, P.L.C.

(57) ABSTRACT

A reflective photomask for EUV light is disclosed. The reflective photomask may include a projecting pattern selectively formed on a substrate and a reflective layer on the substrate and the projecting pattern.

20 Claims, 5 Drawing Sheets

REFLECTIVE PHOTOMASK AND METHOD OF FABRICATING THE SAME

PRIORITY STATEMENT

This application claims priority under 35 U.S.C. §119 to Korean Patent Application No. 10-2006-0010196, filed on Feb. 2, 2006, in the Korean Intellectual Property Office (KIPO), the entire contents of which are incorporated herein by reference.

BACKGROUND

1. Field

Example embodiments relate to a photomask used in a photolithography process in the fabrication of semiconductors. Other example embodiments relate to a reflective photomask.

2. Description of the Related Art

With the development of nanotechnologies, the degree of integration of semiconductor devices is increasing. The result of the increase in the degree of integration of semiconductor devices is that sizes of transistors or other unit elements and wires in the semiconductor devices become further decreased. The next-generation semiconductor technologies may be improved using process techniques for efficiently forming fine patterns, rather than design techniques. The technical ability to form fine patterns may vary based on a photolithography process which is basic in forming a pattern. In the photolithography process including forming a photoresist film on a wafer, transferring information about a pattern to be formed using light, and patterning the photoresist film using a developing solution, light may be the important variable.

The resolution at which it is possible to form a fine pattern depends on the wavelength of light used. At present, the photolithography process may have used i-line at about 365 nm, KrF laser at about 248 nm, and ArF laser at about 193 nm. According to the development of photolithography techniques, the resolution, conventionally limited by the wavelength of light used, may have greatly improved to the extent of forming a pattern corresponding to about ½ of the wavelength. Semiconductor device integration technologies have been developed such that the pattern may not be formed more finely using conventional light sources (ArF, KrF and/or i-line), thus there is a need for a novel light source for use in a semiconductor device fabrication process. Thorough research into the application of EUV (Extreme Ultra-Violet) light, referred to as soft X-rays, to semiconductor device fabrication processes may have been conducted.

EUV light may have a wavelength of about 13.5 nm, which is smaller than the wavelengths of conventional light sources (ArF: about 193 nm, KrF: about 248 nm and i-line: about 365 nm). Because the wavelength of light is directly linked with the resolution of a pattern, the use of EUV light is receiving attention because greater resolution is possible than when using conventional light sources. EUV light is very sensitive and may have increased energy, due to the decreased wavelength thereof, and thus, may not be used for a conventional transparent mask. The transparent substrate of the conventional transparent mask must be subject to increased energy, and the energy efficiency of light may be decreased, leading to decreased resolution. A reflective photomask may have been developed. Such a reflective photomask, which reflects light without transmission, may be subject to less energy due to the reflection of light.

The photomask for EUV light may not be a transparent type but a reflective type, unlike conventional photomasks, and may be considered to be a mirror similar to a photomask reflecting incident light. Such a photomask may be an extension of conventional photomask techniques and may be referred to as a photomask, instead of a photomirror and/or an optical mirror. A conventional reflective photomask is described below.

FIG. 1 is a longitudinal sectional view schematically showing the conventional reflective photomask 100. As shown in FIG. 1, the conventional reflective mask 100 may include a reflective layer 120 formed on a substrate 110, a capping layer 130 formed on the reflective layer 120, a buffer layer 140 formed on the capping layer 130, and an absorbing layer 150 formed on the buffer layer 140. The reflective layer 120 may function to reflect incident EUV light, and the capping layer 130 may act to protect the reflective layer 120 from external physical and chemical damage. The buffer layer 140 may be used to increase adhesion between the capping layer 130 and the absorbing layer 150, and the absorbing layer 150 may function to absorb incident EUV light so as not to reflect the EUV light.

The conventional reflective photomask 100 of FIG. 1 may be completed by sequentially forming the reflective layer 120, the capping layer 130, the buffer layer 140, and the absorbing layer 150, on the substrate 110, and then patterning the absorbing layer 150 and the buffer layer 140. During the fabrication process, the capping layer 130 and the reflective layer 120 may be frequently damaged. The absorbing layer 150 may be formed of chromium and/or tantalum nitride. The buffer layer 140 may be formed of ruthenium and/or chromium nitride. The capping layer 130 may be formed of silicon and/or ruthenium, and the reflective layer 120 may be formed into a multilayered structure including pluralities of silicon layers and molybdenum layers.

In the conventional reflective photomask 100, because the pattern of the absorbing layer 150 and the buffer layer 140 is particularly fine, more stable process conditions may be required upon the formation of the pattern. The selectivity of the photoresist and the absorbing layer 150 upon patterning of the absorbing layer 150, the selectivity of the absorbing layer 150 and the buffer layer 140 upon patterning of the buffer layer 140, and the selectivity of the buffer layer 140 and the capping layer 130 may be difficult to ensure. Where defects (e.g., dark lines and/or pinholes) are created in the absorbing layer 150 and/or the buffer layer 140, the defects may be corrected. The correction process may be used to etch the dark lines using laser and/or ion beams or to cover the pinholes with gallium and/or other materials. During the correction process, the capping layer 130 and the reflective layer 120 may not become more damaged. Because the capping layer 130 and the reflective layer 120 may be further damaged by a chemical cleaning solution upon a cleaning process involved in the fabrication process or correction process, the prevention or reduction of damage to these layers during the cleaning process may be required.

Where the capping layer 130 or the reflective layer 120 is further damaged, light, which is reflected from the damaged portion, may not be reflected through a desired path, such that the pattern may not be uniformly transferred to the wafer. Accordingly, various other materials have been used for the absorbing layer 150, the buffer layer 140, and the capping layer 130 in order to provide more stable etching selectivity and exhibit improved resistance to the correction process and cleaning process. The materials in terms of adhesion of the layers, similar coefficients of thermal expansion, relatively easy patterning and correction, and the price of materials are not easy to replace. Further, although extensive effort to convert the fabrication process into other methods has been conducted, such methods may not use conventional processes and equipment and require the introduction of new equipment, and thus may be difficult to realize.

SUMMARY

Accordingly, example embodiments have been made keeping in mind the above problems occurring in the related art, and example embodiments provide a reflective photomask including a projecting reflective layer.

Example embodiments also provide a method of fabricating such a reflective photomask. Example embodiments provide a reflective photomask including a projecting pattern selectively formed on a substrate, and a reflective layer formed on the substrate and the projecting pattern.

The projecting pattern may have substantially vertical, curved, inclined or recessed sidewalls. The projecting pattern may be thinner than the reflective layer. The projecting pattern may have a thickness of about 50 Å or more. The thickness of the projecting pattern may be increased to about 300 Å or less to stably form the pattern, but example embodiments may not be limited thereto. The projecting pattern may be formed to a thickness of about 1000 Å or more.

The projecting pattern may be formed of any one selected from among metals including chromium, molybdenum, and aluminum, metal compounds, metal alloys and/or inorganic materials. The reflective layer may be in an irregular form having substantially vertical, curved, inclined or recessed sidewalls. The reflective layer may include integral pairs of a first reflective layer and a second reflective layer having refractive indexes different from each other, which are superimposed.

The first reflective layer and the second reflective layer may be respectively formed of silicon and molybdenum and/or molybdenum and silicon. Each of the integral pairs of the first reflective layer and the second reflective layer may have a thickness of about ½±10% of the wavelength of light. The first reflective layer may have a thickness of about ¼±10% of the wavelength of light, and the second reflective layer may have a thickness of about ¼±10% of the first reflective layer. The side wall of the reflective layer may be formed to an angle of about 75° or more. The reflective photomask may further include a capping layer formed on the reflective layer.

The capping layer may be formed of silicon and/or silicon oxide, and may be formed to be thinner than the wavelength of light. The reflective photomask may further include a middle layer formed beneath the reflective layer, the middle layer being formed of silicon and/or silicon oxide. The reflective photomask may further include a conductive film formed beneath the substrate, the conductive film being formed of any one selected from among metals including chromium, molybdenum, and aluminum, metal compounds and/or alloys thereof The reflective layer may have a surface flatness of about 50 nm or less and surface roughness of about 15 nm or less.

The reflective photomask may further include an intermediate reflective layer formed between the first reflective layer and the second reflective layer to be thinner than the first reflective layer and the second reflective layer. The intermediate reflective layer may be formed of boron carbide ($B_4C$). The projecting pattern may be formed by selectively etching the substrate. Example embodiments provide a method of fabricating a photomask, the method including selectively forming a projecting pattern on a substrate and forming a reflective layer on the substrate and the projecting pattern.

The projecting pattern may have substantially vertical, curved, inclined or recessed sidewalls. The projecting pattern may be thinner than the reflective layer, for example, about 50 Å or more. The thickness of the projecting pattern may be increased to about 300 Å or less to stably form the pattern, but example embodiments may not be limited thereto. The projecting pattern may be formed to a thickness of about 1000 Å or more. The projecting pattern may be formed of any one selected from among metals including chromium, molybdenum, and aluminum, metal compounds, metal alloys and/or inorganic materials.

The reflective layer may be in an irregular form having substantially vertical, curved, inclined or recessed sidewalls. The side wall of the reflective layer may be formed to an angle of about 75° or more. The reflective layer may include integral pairs of a first reflective layer and a second reflective layer having refractive indexes different from each other, which are superimposed. The first reflective layer and the second reflective layer may be respectively formed of silicon and molybdenum and/or molybdenum and silicon. Each of the integral pairs of the first reflective layer and the second reflective layer may have a thickness of about ½±10% of the wavelength of light. The first reflective layer may have a thickness of about ¼±10% of the wavelength of light, and the second reflective layer may have a thickness of about ¼±10% of the first reflective layer.

The method may further include forming a capping layer on the reflective layer. The capping layer may be formed of silicon or silicon oxide, and may be thinner than the wavelength of light. The method may further include forming a middle layer beneath the reflective layer, the middle layer being formed of silicon or silicon oxide. The method may further include forming a conductive film beneath the substrate, the conductive film being formed of any one selected from among metals including chromium, molybdenum, and aluminum, metal compounds and/or alloys thereof The reflective layer may have surface flatness of about 50 nm or less and surface roughness of about 15 nm or less.

The method may further include forming an intermediate reflective layer between the first reflective layer and the second reflective layer to be thinner than the first reflective layer and the second reflective layer. The intermediate reflective layer may be formed of boron carbide ($B_4C$). The projecting pattern may be formed by selectively etching the substrate.

BRIEF DESCRIPTION OF THE DRAWINGS

Example embodiments will be more clearly understood from the following detailed description taken in conjunction with the accompanying drawings. FIGS. 1-7 represent non-limiting, example embodiments as described herein.

FIG. 1 is a longitudinal sectional view schematically showing a conventional reflective photomask;

FIG. 4 is an enlarged longitudinal sectional view showing an intermediate reflective layer interposed between the first reflective layer and the second reflective layer in the reflective photomasks according to example embodiments;

FIG. 7 is a graph showing imaging performance of the reflective photomask of example embodiments and the conventional reflective photomask.

DESCRIPTION OF EXAMPLE EMBODIMENTS

Figure 1:
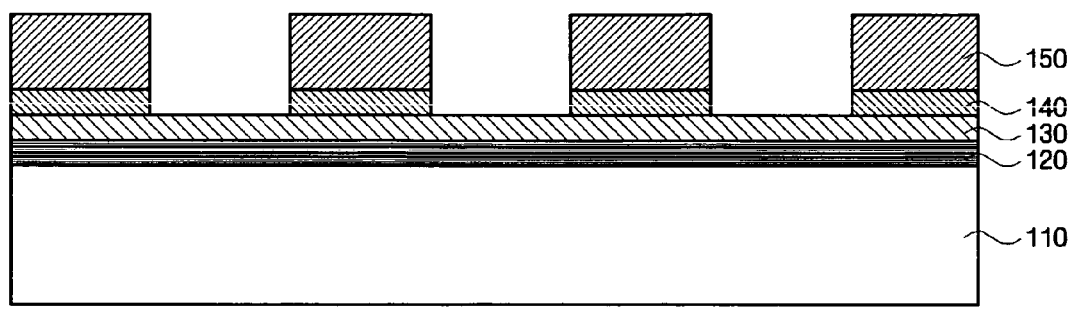

Reference now should be made to the drawings, in which the same reference numerals are used throughout the different drawings to designate the same or similar components. Further, example embodiments are described, with reference to plan views and sectional views provided as ideal illustrations of example embodiments. The type of illustration may vary depending on the fabrication technique and/or allowable error. Thus, example embodiments are not limited to the specific shapes shown in the drawings but include changes in shape that depend on the fabrication process. Accordingly, regions shown in the drawings are schematically depicted, and the shapes thereof are set forth to illustrate the predetermined shapes of the regions of the device of example embodiments, but are not to be construed to limit the scope of example embodiments.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between" and/or "adjacent" versus "directly adjacent").

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). Variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In example embodiments, light means light used for reflective photomasks according to example embodiments, and for example, may be EUV light, having a wavelength of about 13.5 nm. Further, a photoresist may include a resist sensitive to optical radiation or light, and a resist sensitive to electron beams, but nevertheless goes by the name of a photoresist.

Furthermore, the terms 'upper', 'upper portion', 'upper surface', 'lower', 'lower portion', 'lower surface', and 'side surface' indicate relative positions. The photomask may have upper and lower positions upon fabrication different from upon use. Specifically, upon fabrication, the substrate is positioned downwards, while the patterning surface is positioned upwards. Where a pattern is transferred on a wafer, the upper and lower positions may be inverted and thus the substrate is positioned upwards and the patterned surface is disposed downwards. The upper and lower concepts mentioned in example embodiments signify not absolute positions but positions relative to each other. Hereinafter, reflective photomasks and fabrication methods thereof according to example embodiments are described.

Figure 2A:
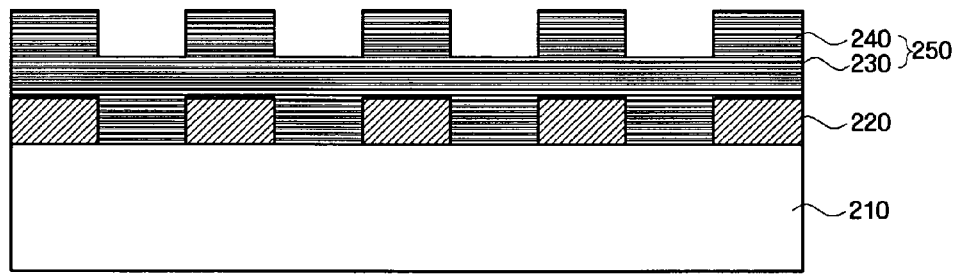
FIGS. 2A and 2B are longitudinal sectional views schematically showing reflective photomasks according to example embodiments.
Figure 2B:
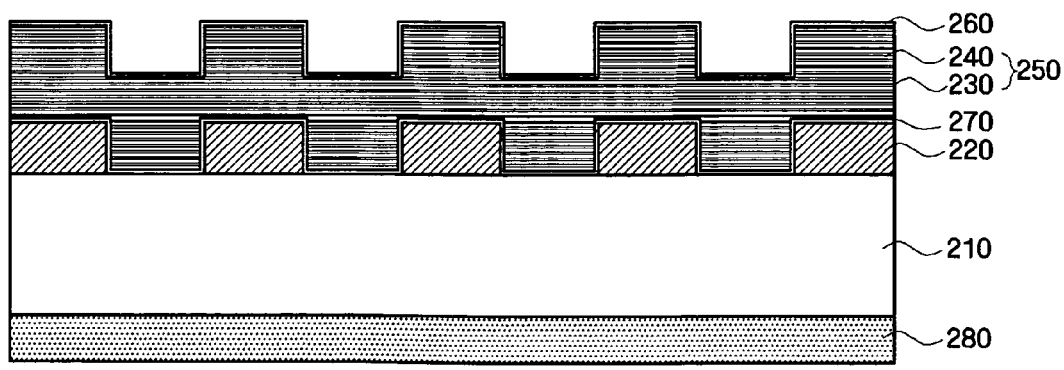

FIGS. 2A and 2B are longitudinal sectional views schematically showing the reflective photomasks 200a, 200b, according to example embodiments. As shown in FIG. 2A, the reflective photomask 200a according to example embodiments may include a projecting pattern 220 selectively formed on a substrate 210, and a reflective layer 250 formed on the substrate 210 and the projecting pattern 220. The substrate 210 may be formed of glass. Because the photomask of example embodiments is not a transparent photomask, the substrate may not be formed of transparent material. The substrate 210 may be formed of ceramics or other inorganic materials having improved durability. With glass, the substrate may be advantageously formed at a decreased temperature.

The projecting pattern 220 may be relatively thick such that destructive interference between light reflected from the reflective layer 250 formed on the top surface of the projecting pattern 220 and light reflected from the reflective layer 250 formed on the bottom surface thereof occurs. The projecting pattern 220, having information about a pattern to be formed on the wafer, may have a thickness of about 50 Å or more. The thickness of the projecting pattern 220 may be increased to about 300 Å or less in order to stably form the pattern, but example embodiments may not be limited thereto. The thickness may be increased to about 1000 Å or more.

The thickness of the projecting pattern 220 may be set such that the projecting pattern 220 is formed so as to cause destructive interference between light reflected from the reflective layer 250, which is formed on the top surface of the projecting pattern 220, and light reflected from the reflective layer 250, which is formed on the bottom surface thereof The thickness of the projecting pattern 220 may have a phase difference of about 180° between light reflected from the reflective layer 250 which is formed on the top surface of the projecting pattern 220 and light reflected from the reflective layer 250 which is formed on the bottom surface thereof Even though one set of light rays and the other may have a phase difference of about ¼ to about ¾ of a wavelength, destructive interference may take place, and thus example embodiments may not be limited to a phase difference of about 180°. The projecting pattern 220 may have a thickness that is obtained by adding or subtracting about ¼ to about ¾ of a wavelength to or from integer multiples of the wavelength of light used.

The projecting pattern 220 may also be formed such that light reflected from the reflective layer 250, which is formed on the top surface of the projecting pattern 220, may have a focal distance (or plane) different from that of light reflected from the reflective layer 250 which is formed on the bottom surface thereof When the pattern is formed (exposed) coinciding with the focus range of light used, unused light may prevent or reduce the formation of an image at the focal distance. When the projecting pattern 220 is relatively thick, the focal distance between one set of light rays and the other may be increased, therefore more easily forming the pattern.

The thickness of the projecting pattern 220 may be about 50 Å, but there is no theoretical upper limit thereto. The projecting pattern 220 may be formed of material which may have improved adhesion to the substrate 210, may be easily patterned, and may have a similar coefficient of thermal expansion. In example embodiments, chromium may be applied, but example embodiments are not limited thereto. The projecting pattern 220 may be formed of any one selected from among metals, including molybdenum, tantalum and/or aluminum, in addition to chromium, metal compounds and/or alloys, and other materials. The reflective layer 250 may be used to reflect incident light like a mirror, and may include a first reflective layer 230 and a second reflective layer 240. The first reflective layer 230 and the second reflective layer 240 may be formed of materials having refractive indexes different from each other. For example, the first reflective layer 230 may be a silicon layer and the second reflective layer 240 may be a molybdenum layer. Alternatively, the first reflective layer 230 may be a molybdenum layer and the second reflective layer 240 may be a silicon layer. The silicon layer and the molybdenum layer used in example embodiments may not be selected to limit example embodiments but may be selected to illustrate the technical spirit of example embodiments.

The reflective layer 250 may be provided in such a manner that integral pairs of the first reflective layer 230 and the second reflective layer 240 may be superimposed. Each of the integral pairs of the first reflective layer 230 and the second reflective layer 240 may be formed to a thickness of about ½±10% of the wavelength of light. The first reflective layer 230 may be formed to a thickness of about ¼±10% of the wavelength of light, and the second reflective layer 240 may be formed to a thickness of about ¼±10% of the first reflective layer 230.

The specific process of forming the first reflective layer 230 and the second reflective layer 240 is given below with reference to the drawings provided to describe the method of fabricating example embodiments. In example embodiments, light reflected from the first reflective layer 230 and light reflected from the second reflective layer 240 may result in destructive interference.

Light reflected from the first reflective layer 230 and light reflected from the second reflective layer 240 may have a phase difference of about 180°, for example, a phase difference of about ½ of a wavelength. Even if there is a phase difference of about ¼ to about ¾ of a wavelength, destructive interference may occur. In the reflective photomask 200a according to example embodiments, the thickness of the reflective layers 230, 240 may be appropriately controlled so as to realize destructive interference between light reflected from the first reflective layer 230 and light reflected from the second reflective layer 240. For example, when the wavelength of light is about 13.5 nm, a pair of the reflective layers 230, 240, having a thickness of about ½±10% of the wavelength of light, may have a thickness of about 6.75 nm±10%, for example, from about 6.075 nm to about 7.425 nm. If the thickness ratio of the first reflective layer 230 to the second reflective layer 240 is about 1:¾, the total thickness of the reflective layers 230, 240 may be about ⁷⁄₄. If the total thickness of the reflective layers 230, 240 is about 7 nm, the first reflective layer 230 may have a thickness of about 4 nm and the second reflective layer 240 may have a thickness of about 3 nm.

Where the first reflective layer 230 is formed to a thickness of about 4.1 nm using silicon, the second reflective layer 240 may have a thickness of about 15 atomic layers thick. Where the second reflective layer 240 is formed to a thickness of about 2.7 nm using molybdenum, the second reflective layer may have a thickness of about 11 atomic layers. In example embodiments, thus, the total thickness of the reflective layers 230, 240 may be about 6.8 nm, in which the first reflective layer 230 may be about 4.1 nm thick and the second reflective layer 240 may be about 2.7 nm thick, but example embodiments may not be limited thereto.

The total thickness of the reflective layer 250 may vary with the amount of pairs of the first reflective layer 230 and the second reflective layer 240 that may be superimposed. The reflectivity may change depending on the thickness of the reflective layer 250. For example, where about 40 pairs of the first reflective layer 230 and the second reflective layer 240 are superimposed, stable performance may be expected. The total thickness of the reflective layer 250 may be calculated to be about 270 nm, but example embodiments may not be limited thereto. The first reflective layer 230 and the second reflective layer 240 may be provided in greater or smaller numbers. Even if at least 50 pairs of the layers are superimposed, an abnormal condition may not result. When at least 50 pairs of the first reflective layer 230 and the second reflective layer 240 are superimposed, the total thickness of the reflective layer may be about 340 nm.

The side wall of the reflective layer 250 may be formed to an angle of about 75° or more, for example, about 85° or more. Because the reflective layer 250 is provided on the substrate 210 having the projecting pattern 220 formed thereon, the reflective layer may be more thinly formed on the side wall thereof along the shape of the projecting pattern 220. The reflective layer formed on the side wall thereof may malfunction, thus rendering the shape of the pattern formed on the wafer unclear. As a result of experiments varying the angle of the side wall, it may be confirmed that the pattern may be uniformly formed at about 75°, for example, at about 85°, resulting in a negligible effect of the side wall on the pattern.

The surface of the reflective layer 250 may be formed to have a flatness of about two times the line width of the pattern or less, and roughness of the line width or less. The flatness and roughness of the reflective layer 250 may affect the focus of light to be reflected, the reflection direction, and the intensity, and thus the uniformity of the pattern to be transferred on the wafer. When the line width of the pattern to be formed is about 30 nm, stable pattern formation may be expected by ensuring flatness of about 60 nm or less and roughness of about 30 nm or less.

An intermediate reflective layer 235 (FIG. 4) may be interposed between the first reflective layer 230 and the second reflective layer 240. A detailed description of the intermediate reflective layer 235 (FIG. 4) is given below with reference to FIG. 4. As shown in FIG. 2B, the reflective photomask 200b according to example embodiments further may include a capping layer 260, a middle layer 270, and a conductive film 280. The capping layer 260 may be provided on the reflective layer 250. The capping layer 260 may be formed of silicon and/or silicon oxide in order to protect the reflective layer 250 from physical or chemical damage.

The capping layer 260 may be thinner than the wavelength of light. If the capping layer 260 is thicker than the wavelength of light, the wavelength of light may be negatively affected. The capping layer 260 may be thinner than the wavelength of light. Further, the middle layer 270 may be provided beneath the reflective layer 250. The middle layer 270 may function to increase adhesion between the projecting pattern 220 and substrate 210 and the reflective layer 250. The flatness of the substrate 210 or projecting pattern 220 may be improved. The middle layer 270 may be formed of silicon and/or silicon oxide.

Beneath the substrate 210, the conductive film 280 may be provided. When the reflective photomask 200b is used to transfer the pattern on the wafer using an exposure system, the conductive film 280 may function to hold the reflective photomask 200b using an electrostatic chuck of the exposure system or to protect it from static electricity. The conductive film 280 may be formed of any one selected from among metals, including chromium, molybdenum, and aluminum, metal compounds and/or alloys thereof. The first reflective layer 230 and the second reflective layer 240 further may have the intermediate reflective layer 235 (FIG. 4) therebetween. A detailed description of the intermediate reflective layer 235 (FIG. 4) is given below with reference to FIG. 4. The surface of the reflective layer 250 may be formed to have a flatness of about two times the line width of the pattern or less and roughness of the line width or less.

Figure 3A:
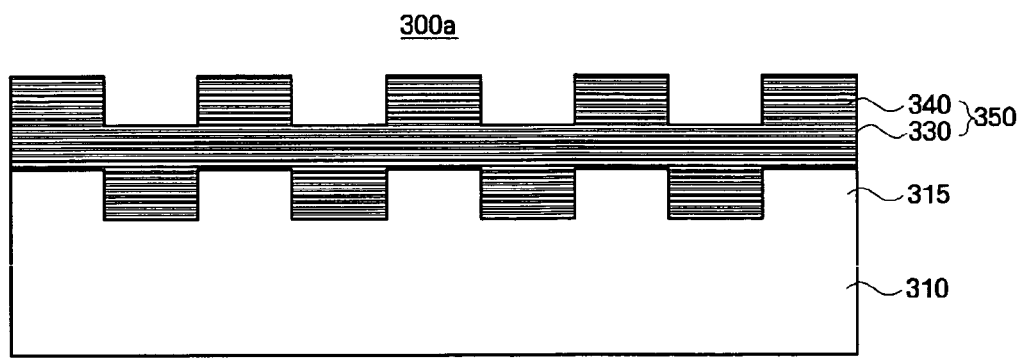
FIGS. 3A and 3B are longitudinal sectional views schematically showing reflective photomasks according to example embodiments.
Figure 3B:
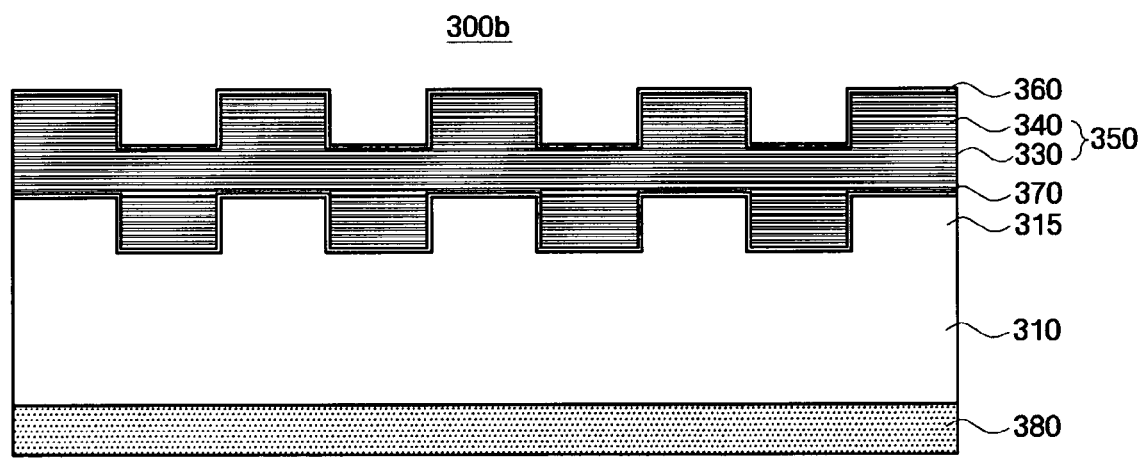

FIGS. 3A and 3B are longitudinal sectional views schematically showing the reflective photomasks 300a, 300b, according to example embodiments. As shown in FIG. 3A, the reflective photomask 300a may have a substrate 310 having an irregular pattern 315 selectively formed thereon, and a reflective layer 350. The irregular pattern 315 may have a function and shape the same as those of the projecting pattern 220, and thus the above two terms may be used together. In example embodiments, when the pattern is formed using material which is different from that of the substrate 310, it is referred to as the projecting pattern 220. Alternatively, when the pattern is formed using material which is the same as that of the substrate 310, it is referred to as the irregular pattern 315. However, example embodiments may not be limited thereto.

The substrate 310 may be formed of glass. Because the photomask of example embodiments is not a transparent photomask, the substrate 310 may not be formed of transparent material. The substrate 310 may be formed of ceramics or other inorganic materials having improved durability. With glass, the substrate may be formed at a decreased temperature.

The irregular pattern 315, which has information about a pattern to be formed on a wafer, like the projecting pattern 220 of FIG. 2A, may be formed to a thickness of about 50 Å or more. In order to stably form the pattern, the thickness of the irregular pattern may be increased to about 300 Å or less, but example embodiments may not be limited thereto. The irregular pattern may be formed to a thickness of about 1000 Å or more.

The irregular pattern 315 may be formed to a thickness so as to cause destructive interference between light reflected from the reflective layer 350 which is formed on the top surface of the irregular pattern 315 and light reflected from the reflective layer 350 which is formed on the bottom surface thereof. The irregular pattern 315, having information about the pattern to be formed on the wafer, may have a thickness of about 50 Å or more. The thickness of the irregular pattern may be increased to about 300 Å or less in order to more stably form the pattern, but example embodiments may not be limited thereto. The irregular pattern may be formed to a thickness of about 1000 Å or more.

The thickness of the irregular pattern 315 may be formed such that destructive interference between light reflected from the reflective layer 350 which is formed on the top surface of the irregular pattern 315 and light reflected from the reflective layer 350 which is formed on the bottom surface thereof occurs.

The thickness of the irregular pattern 315 may be to set a phase difference of about 180° between light reflected from the reflective layer 350 on the top surface of the irregular pattern 315 and light reflected from the reflective layer 350 on the bottom surface thereof. Even if there is a phase difference of about ¼ to about ¾ of a wavelength, destructive interference may occur, and thus example embodiments may not be limited to a phase difference of about 180°. The irregular pattern 315 may have a thickness that is obtained by adding or subtracting about ¼ to about ¾ of a wavelength to or from integer multiples of the wavelength of light used. The irregular pattern 315 may be formed such that light reflected from the reflective layer 350 which is formed on the top surface of the irregular pattern 315 may have a focal distance (or plane) different from that of light reflected from the reflective layer 350 which is formed on the bottom surface thereof When the pattern is formed coinciding with the focus range of light used therefor, unused light may prevent or reduce the formation of an image at the focal distance. When the irregular pattern 315 is thick, the focal distance between one set of light rays and the other may be increased, therefore more easily forming the pattern.

The thickness of the irregular pattern 315 may be formed to about 50 Å, there being no theoretical upper limit thereto. The irregular pattern 315 may be formed through a selective etching process. The process of forming the irregular pattern 315 is given below. The reflective layer 350 may be used to reflect incident light like a mirror, and may include a first reflective layer 330 and a second reflective layer 340. The first reflective layer 330 and the second reflective layer 340 may be formed of materials having refractive indexes different from each other. For example, the first reflective layer 330 may be a silicon layer and the second reflective layer 340 may be a molybdenum layer. Alternatively, the first reflective layer 330 may be a molybdenum layer and the second reflective layer 340 may be a silicon layer. The silicon layer and the molybdenum layer used in example embodiments are not selected to limit example embodiments but may be selected to illustrate the technical spirit of example embodiments.

The reflective layer 350 may be provided in such a manner that integral pairs of the first reflective layer 330 and the second reflective layer 340 are superimposed. Each of the integral pairs of the first reflective layer 330 and the second reflective layer 340 may have a thickness of about ½±10% of the wavelength of light. The first reflective layer 330 may have a thickness of about ¼±10% of the wavelength of light, and the second reflective layer 340 may have a thickness of about ¼±10% of the first reflective layer 330. The side wall of the reflective layer 350 may be formed to an angle of about 75° or more, for example, about 85° or more.

The surface of the reflective layer 350 may be formed to have a flatness of about two times the line width of the pattern or less and roughness of the line width or less. The intermediate reflective layer 235 (FIG. 4) may be interposed between the first reflective layer 330 and the second reflective layer 340. A detailed description of the intermediate reflective layer 235 (FIG. 4) is given below with reference to FIG. 4. As shown in FIG. 3B, the reflective photomask 300b according to example embodiments further may include a capping layer 360, a middle layer 370, and a conductive film 380. The capping layer 360 may be provided on the reflective layer 350. The capping layer 360 may be formed of silicon or silicon oxide to protect the reflective layer 350 from physical or chemical damage. The capping layer 360 may be thinner than the wavelength of light. The middle layer 370 may be provided beneath the reflective layer 350. The middle layer 370 may function to increase adhesion between the substrate 310, the irregular pattern 315, and the reflective layer 350.

The flatness of the substrate 310 and the irregular pattern 315 may be improved. The middle layer 30 may be formed of silicon and/or silicon oxide.

Beneath the substrate 310, the conductive film 380 may be provided. When the reflective photomask 300b is used to transfer a pattern on the wafer using an exposure system, the conductive film 380 functions to hold the reflective photomask 300b using an electrostatic chuck of the exposure system or to protect it from static electricity. The conductive film 380 may be formed of any one selected from among metals, including chromium, molybdenum, and aluminum, metal compounds, and alloys thereof The first reflective layer 330 and the second reflective layer 340 further may have the intermediate reflective layer 235 (FIG. 4) therebetween. A detailed description of the intermediate reflective layer 235 (FIG. 4) is given below with reference to FIG. 4. The surface of the reflective layer 350 may have a flatness of about two times the line width of the pattern or less and roughness of the line width or less.

Figure 4:
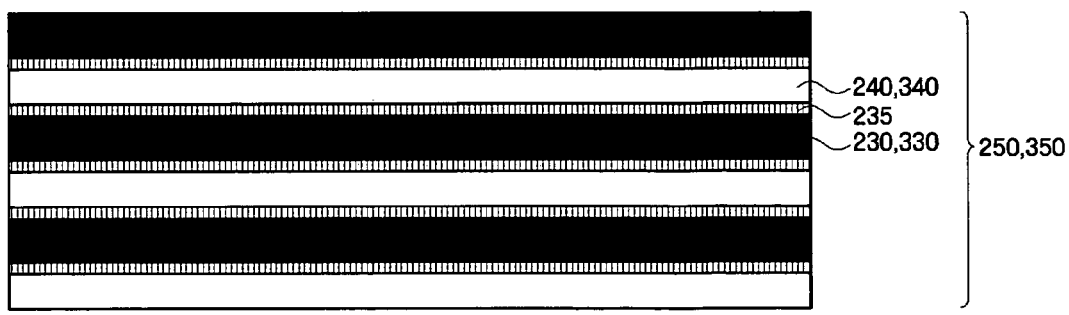

FIG. 4 is an enlarged longitudinal sectional view showing the intermediate reflective layer interposed between the first reflective layer 230, 330 and the second reflective layer 240, 340 in the reflective photomasks 200a, 200b, 300a, 300b according to example embodiments. As shown in FIG. 4, the intermediate reflective layer 235 may be formed between the first reflective layer 230, 330 and the second reflective layer 240, 340. The intermediate reflective layer 235 may be formed using boron carbide ($B_4C$) and may be thinner than the first reflective layer 230, 330 and the second reflective layer 240, 340.

When the intermediate reflective layer 235 is formed, the first reflective layer 230, 330 or the second reflective layer 240, 340 may be thinly formed, such that the total thickness of a unit reflective layer (having a four-layered structure including the first reflective layer, an intermediate reflective layer, the second reflective layer, and an intermediate reflective layer) may be similar to that of a unit reflective layer having no intermediate reflective layer 235.

For example, when the first reflective layer 230, 330 has a thickness of about 4.1 nm, one intermediate reflective layer may have a thickness of about 0.25 nm, the second reflective layer may have a thickness of about 2.05 nm, and the other intermediate reflective layer may have a thickness of about 0.4 nm, a unit reflective layer having a thickness of about 6.8 nm may be formed. The thickness of the reflective layers 230, 240, 330, 340, 235 may be variously controlled within a range that does not inhibit the purpose of example embodiments. Light in the presence of the intermediate reflective layer 235 may be reflected slightly differently than light in the absence of the intermediate reflective layer 235.

The thickness of the reflective layers 230, 240, 330, 340, 235 and the unit reflective layer may be thicker or thinner. For example, when the first reflective layer 230, 330 is formed of silicon, atomic layers may be about 4.14 nm. When the second reflective layer 240, 340 is formed of molybdenum, atomic layers may be about 2.09 nm. The unit reflective layer 250 may have a thickness of about 6.88 nm. The above thicknesses may be intended to experimentally or numerically illustrate the technical spirit of example embodiments, but do not limit the technical spirit of example embodiments. Hereafter, the methods of fabricating the photomask according to example embodiments are specifically described.

Figure 5A:
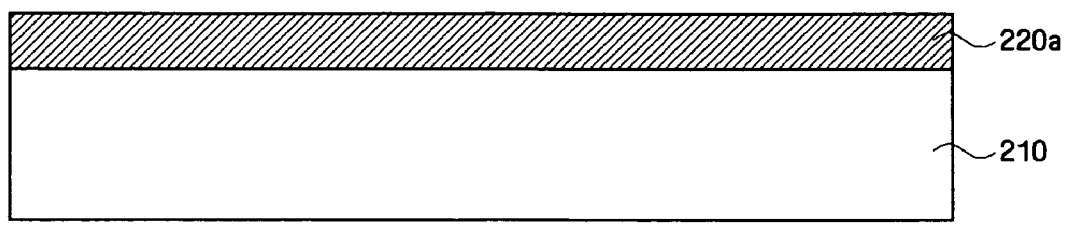
FIGS. 5A to 5D are longitudinal sectional views schematically showing the process of fabricating the reflective photomask according to example embodiments.

FIGS. 5A to 5D are longitudinal sectional views schematically showing the process of fabricating the reflective photomask 200a according to example embodiments. As shown in FIG. 5A, a material layer 220a for forming the projecting pattern 220 may be formed on the substrate 210. The material layer 220a for forming the projecting pattern 220 may be formed of material which has improved adhesion to the substrate 210, may be more easily patterned, and may have a similar coefficient of thermal expansion. In example embodiments, chromium may be applied. The projecting pattern 220 may be formed of metals, including molybdenum, tantalum, and aluminum, in addition to chromium, metal compounds or alloys and/or other materials. The chromium layer may be provided so as to experimentally illustrate the technical spirit of example embodiments, but example embodiments may not be limited thereto. Where chromium is used as the material layer 220a for forming the projecting pattern 220, a sputtering process may be useful.

Figure 5B:
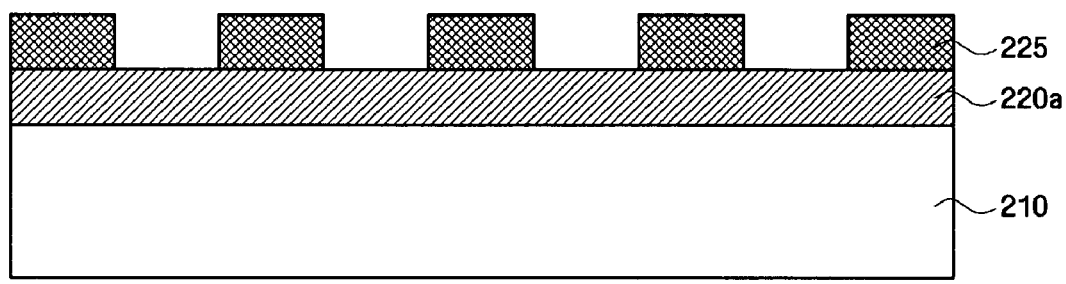

As shown in FIG. 5B, a resist pattern 225 may be formed on the material layer 220a for forming the projecting pattern 220. The resist pattern 225 may be either a photoresist pattern and/or an electron beam resist pattern. In example embodiments, the pattern may be formed using an electron beam resist, which is merely illustrative of the technical spirit of example embodiments, and example embodiments may not be limited thereto. The resist pattern 225 may be formed through a reaction between an electron beam resist, irradiated with electron beams, and an alkaline developing solution.

Figure 5C:
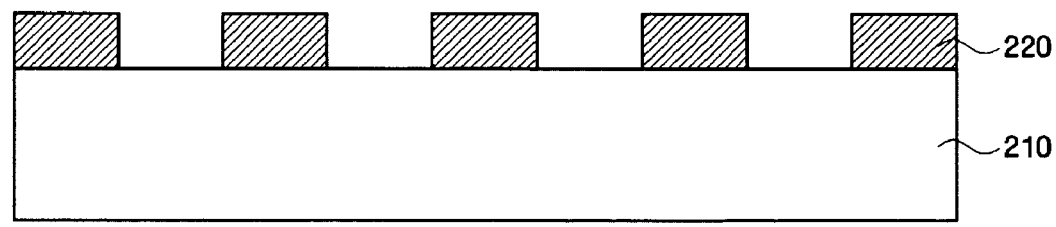

As shown in FIG. 5C, the material layer 220a maybe patterned using the resist pattern 225 as an etching mask, thereby forming the projecting pattern 220. The projecting pattern 220 may have information about a pattern to be transferred on the wafer. The projecting pattern 220 may result from patterning of the material layer 220a selectively exposed by the resist pattern 225 using a combination of $Cl_2$, $BCl_3$, $SiCl_4$, and HBr gases and/or a combination of $SF_6$, $C_2F_6$, and $Cl_2$ gases. Ar or $O_2$ gas may be further included. Alternatively, an acidic etchant may be applied to patterning. After the formation of the projecting pattern 220, the resist pattern 225 may be completely removed using $O_2$ gas and/or by dipping it in sulfuric acid.

Figure 5D:
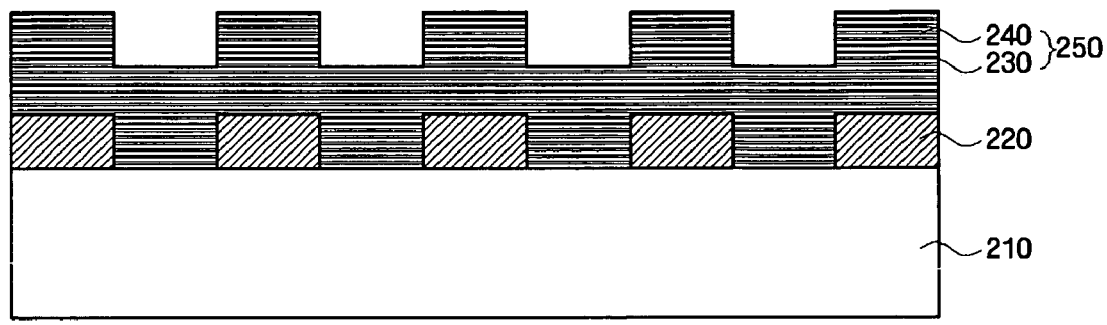

As shown in FIG. 5D, the reflective layer 250 may be formed on the substrate 210 having the exposed projecting pattern 220, therefore completing the reflective photomask 200a according to example embodiments. The reflective layer 250 may include the first reflective layer 230 and the second reflective layer 240. The reflective layer 250 may be formed by superimposing tens of pairs of the first reflective layer 230 and the second reflective layer 240. The first reflective layer 230 may be formed of silicon, and the second reflective layer 240 may be formed of molybdenum. Alternatively, the first reflective layer 230 may be formed of molybdenum and the second reflective layer 240 may be formed of silicon.

The first reflective layer 230 and the second reflective layer 240 may be formed through sputtering and/or deposition. In example embodiments, the sputtering process may be applied, which is merely illustrative of the technical spirit of example embodiments, and example embodiments may not be limited thereto. The deposition process may be atomic layer deposition, chemical vapor deposition, plasma deposition and/or metal organic deposition. The sputtering process may be well known in the art, and a detailed description thereof is omitted.

In the reflective photomask 200b shown in FIG. 2B, the middle layer 270 may be formed after the process in FIG. 5C, and the capping layer 260 may be formed after the process in FIG. 5D. After the process in FIG. 5C, the middle layer 270 may be formed using silicon or silicon oxide through sputtering or deposition. After the process in FIG. 5D, the capping layer 260 may be formed using silicon or silicon oxide through sputtering or deposition. The conductive film 280 may be formed before or after the process in FIGS. 5A to 5D.

Figure 6A:
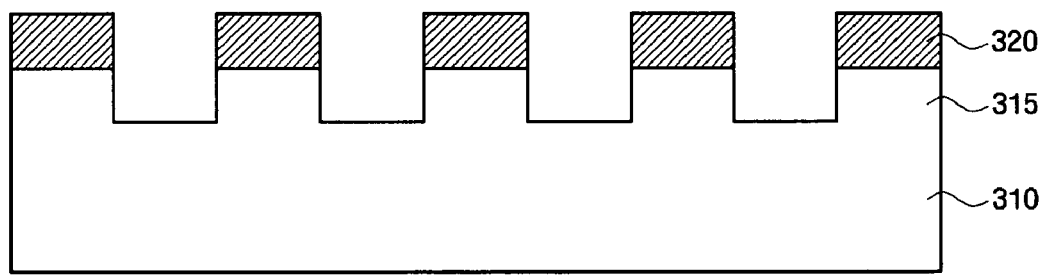
FIGS. 6A to 6C are longitudinal sectional views schematically showing the process of fabricating the reflective photomask according to example embodiments.
Figure 6B:
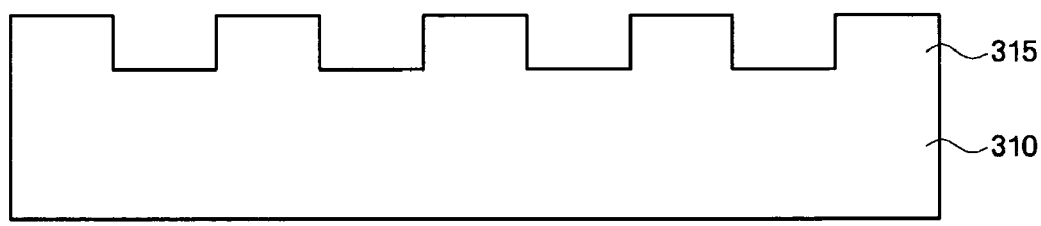
Figure 6C:
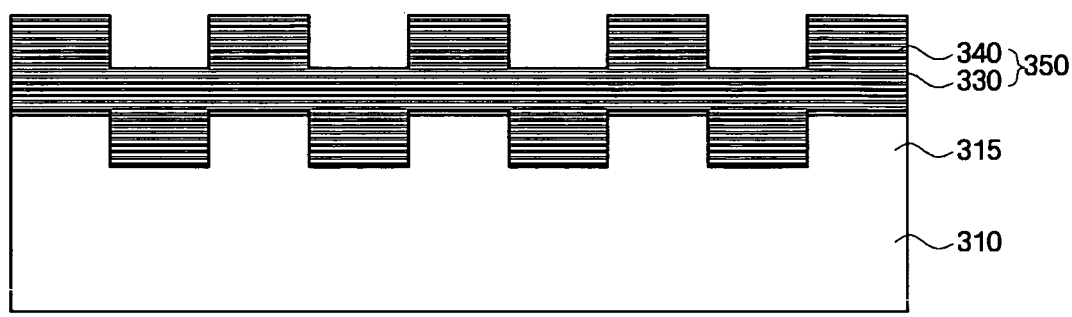

The conductive film 280 may be formed of any one selected from among metals, including chromium, molybdenum, and aluminum, metal compounds and/or alloys thereof FIGS. 6A to 6C are longitudinal sectional views schematically showing the process of fabricating the reflective photomask 300a according to example embodiments. As shown in FIG. 6A with reference to the steps of FIGS. 5a to 5C, a mask pattern 320 for roughening a substrate 310 may be formed on the substrate 310. The mask pattern 320 may be subjected to the same processes as those of FIGS. 5A to 5C, in consideration of process compatibility. Alternatively, the processes of forming the material layer 220a and the projecting pattern 220 of FIGS. 5A to 5C may be applied using additional material. The mask pattern 320 may be formed of material having etching selectivity as in the resist pattern 315 and the substrate 310.

As shown in FIG. 6B, the substrate 310 may be etched using the mask pattern 320 as an etching mask, thus forming the irregular pattern 315, after which the mask pattern 320 is removed. When the substrate 310 is formed of glass, a process of etching silicon oxide may be applied. When the substrate 310 is formed of ceramics, an irregular surface may be formed. If other materials may be used in the substrate, an etching process suitable for the materials may be introduced. The etching process depends on the type of material and is well known in the art, and thus a description thereof is omitted.

As shown in FIG. 6C, the reflective layer 350 may be formed on the substrate 310 having the irregular pattern 315, therefore completing the reflective photomask 300a according to example embodiments. The reflective layer 350 may include the first reflective layer 330 and the second reflective layer 340. The reflective layer 350 may be formed by superimposing tens of pairs of the first reflective layer 330 and the second reflective layer 340. The first reflective layer 330 may be formed of silicon, and the second reflective layer 340 may be formed of molybdenum. Alternatively, the first reflective layer 330 may be formed of molybdenum and the second reflective layer 340 may be formed of silicon.

The first reflective layer 330 and the second reflective layer 340 may be formed through sputtering and/or deposition. In example embodiments, the sputtering process may be applied, which is merely illustrative of the technical spirit of example embodiments, and example embodiments may not be limited thereto. The deposition process may be atomic layer deposition, chemical vapor deposition, plasma deposition and/or metal organic deposition. The sputtering process is well known in the art, and thus a detailed description thereof is omitted.

As in the reflective photomask 300b shown in FIG. 3B, the middle layer 370 may be formed after the process in FIG. 6B, and the capping layer 360 may be formed after the process in FIG. 6C. After the process in FIG. 6B, the middle layer 370 may be formed using silicon and/or silicon oxide through sputtering and/or deposition. After the process in FIG. 6C, the capping layer 360 may be formed using silicon and/or silicon oxide through sputtering and/or deposition. The conductive film 380 may be formed before and after the individual processes of FIGS. 6A to 6C. The conductive film 380 may be formed of any one selected from among metals, including chromium, molybdenum, and aluminum, metal compounds and/or alloys thereof.

Figure 7:
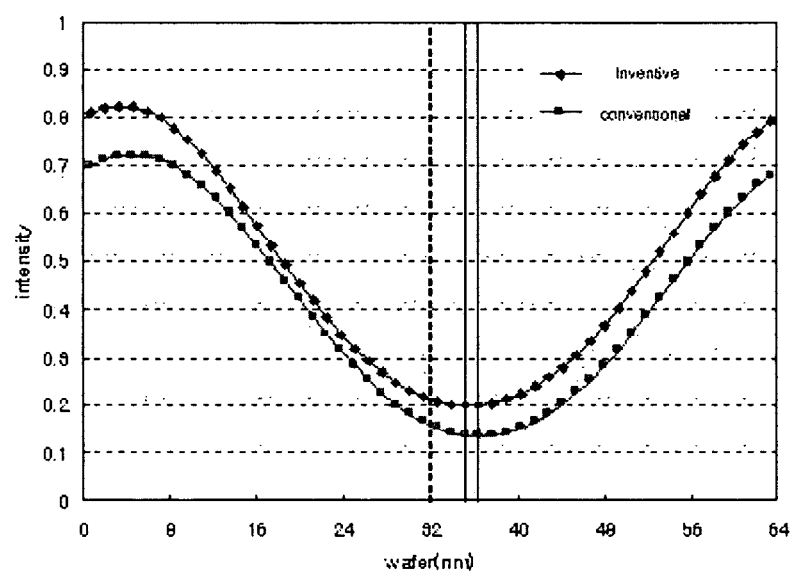

FIG. 7 is a graph showing imaging performance of the reflective photomask 200a according to example embodiments and the conventional reflective photomask 100. As shown in FIG. 7, the spatial image formed using the reflective photomask 200a of example embodiments may have imaging performance similar to a spatial image formed using a conventional reflective photomask 100, but the reflective photomask 200a of example embodiments may exhibit improved performance in terms of the pattern shift.

Specifically, the X axis shows the position on the wafer, and the Y axis shows light intensity. FIG. 7 is a graph resulting from the measurement of light intensity and pattern shift through application of the pattern of about 32 nm. In the drawing, the two curves are spatial image showing the light intensity, and the central vertical dotted line among three vertical lines designates the central portion of the pattern, and the two vertical lines on the right designate the pattern shift of each of the reflective photomask of example embodiments and the conventional reflective photomask.

The imaging performance of the photomask may be represented by contrast between light intensity measured in the region irradiated with light and light intensity measured in the region not irradiated with light. As the contrast is increased, imaging performance may improve.

The contrast is determined as follows:

$$\text{Contrast} = \{(I_{max} - I_{min})/(I_{max} + I_{min})\}$$

wherein $I_{max}$: the greatest light intensity in the region irradiated with light, and $I_{min}$: the smallest light intensity in the region not irradiated with light.

The values shown in the graph of FIG. 7 are substituted into the equation above to calculate the contrast of each of the photomasks. The conventional reflective photomask 100 may have contrast of about 0.67, while the reflective photomask 200a of example embodiments may have contrast of about 0.6, which is similar to that of a conventional photomask. If the technical spirit of example embodiments is refined in further experiments and is optimized, imaging performance may be improved.

The central vertical dotted line of FIG. 7 may correspond to the original position of the pattern, and the two vertical lines on the right designate the pattern shift of each of the reflective photomask of example embodiments and the conventional reflective photomask. Light may not enter and may not be reflected perpendicular to the reflective photomask, but may enter and may be reflected at a smaller angle, for example, at an angle of about 1~6°. When the angle at which light enters and is reflected is increased, the pattern shift may occur.

In FIG. 7, the pattern shift of the reflective photomask 200a of example embodiments may be about 3 nm, while the pattern shift of the conventional reflective photomask 100 may be about 4.5 nm. The pattern shift of the reflective photomask 200a of example embodiments may therefore be improved compared to the conventional reflective photomask 100. Further, the smaller pattern shift may result in a uniform formation of the pattern, and thus the formation of the fine pattern may become more favorable. The reflective photomask 200a of example embodiments may have improved pattern resolution compared to the conventional reflective photomask 100.

During the fabrication of the reflective photomasks 200a, 200b, 300a, 300b according to example embodiments, a correction process may not be applied and a cleaning process may be minimally conducted. The cleaning process may be performed after all of the processes of FIGS. 5A to 5D and FIGS. 6A to 6C. In example embodiments, the cleaning process may be performed once after the formation of the reflective layer 250, 350. Further, the cleaning process used in example embodiments may not be a hard cleaning process applied when defects or bad dust may be present, but a soft cleaning process, which may only slightly deteriorate the reflective layer 250, 350.

For reference, where defects or bad dust are generated on the surface of the reflective photomasks 200a, 200b, 300a, 300b, the hard cleaning process may be conducted in such a manner that an acidic or alkaline chemical cleaning solution or cleaning gas is chemically or physically reacted with the surface defects or bad dust of the reflective photomasks 200a, 200b, 300a, 300b while applying ultrasonic waves or UV light thereon, followed by removing such defects or bad dust from the surface of the reflective photomask 200a, 200b, 300a, 300b. The soft cleaning process may be a process using a neutral cleaning solution that does not deteriorate the surface of the reflective photomask 200a, 200b, 300a, 300b, and may use pure water.

Because the correction process, which physically and chemically deteriorates the reflective layers 250, 350 as mentioned above, is not required during the fabrication process of example embodiments, the quality of the reflective photomasks 200a, 200b, 300a, 300b may be maintained. As described hereinbefore, example embodiments provide a reflective photomask having a reflective layer and a fabrication method thereof In the reflective photomasks according to example embodiments, the reflective layer may be prepared through a more stable process without being further damaged, and may have a simpler structure, thus increasing pattern formability and productivity and decreasing the cost of fabrication.

Although example embodiments have been disclosed for illustrative purposes, those skilled in the art will appreciate that various modifications, additions and substitutions are possible, without departing from the scope and spirit of the accompanying claims.

What is claimed is:

1. A reflective photomask comprising:
   a projecting pattern selectively formed on a substrate; and
   a reflective layer on the substrate and the projecting pattern,
   wherein the projecting pattern contacts and protrudes from the substrate, and wherein the reflective layer covers a top surface of the projecting pattern and side walls of the projecting pattern.

2. The photomask of claim 1, wherein the projecting pattern is thinner than the reflective layer.

3. The photomask of claim 2, wherein the projecting pattern has a thickness that causes destructive interference between light reflected from a reflective layer formed on a top surface of the projecting pattern and light reflected from a reflective layer formed on a bottom surface thereof.

4. The photomask of claim 1, wherein the projecting pattern is formed of any one selected from among metals including chromium, molybdenum, and aluminum, metal compounds, metal alloys, and inorganic materials.

5. The photomask of claim 1, wherein the reflective layer includes integral pairs of a first reflective layer and a second reflective layer having refractive indexes different from each other, which are superimposed.

6. The photomask of claim 5, wherein the first reflective layer and the second reflective layer are respectively formed of silicon and molybdenum or molybdenum and silicon.

7. The photomask of claim 5, wherein each of the integral pairs of the first reflective layer and the second reflective layer has a thickness of $\frac{1}{2} \pm 10\%$ of a wavelength of light used.

8. The photomask of claim 5, wherein the first reflective layer has a thickness of $\frac{1}{4} \pm 10\%$ of a wavelength of light used, and the second reflective layer has a thickness of $\frac{1}{4} \pm 10\%$ of the first reflective layer.

9. The photomask of claim 5, further comprising:
   an intermediate reflective layer between the first reflective layer and the second reflective layer, wherein the intermediate reflective layer is thinner than the first reflective layer and the second reflective layer.

10. The photomask of claim 9, wherein the intermediate reflective layer is formed of boron carbide.

11. The photomask of claim 1, wherein the reflective layer has a top surface and a bottom surface and has a side wall angled at 75° or more.

12. The photomask of claim 1, wherein the reflective layer has surface flatness of 50 nm or less and surface roughness of 15 nm or less.

13. The photomask of claim 1, wherein the projecting pattern is formed by selectively etching the substrate.

14. A method of fabricating a photomask, the method comprising:
   selectively forming a projecting pattern on a substrate; and
   forming a reflective layer on the substrate and the projecting pattern, wherein the projecting pattern contacts and protrudes from the substrate, and wherein the reflective layer covers a top surface of the projecting pattern and side walls of the projecting pattern.

15. The method of claim 14, wherein the projecting pattern is thinner than the reflective layer.

16. The method of claim 14, wherein the forming the reflective layer is conducted by superimposing pairs of a first reflective layer and a second reflective layer.

17. The method of claim 16, wherein the first reflective layer and the second reflective layer are respectively formed of silicon and molybdenum or molybdenum and silicon.

18. The method of claim 16, wherein each of the pairs of the first reflective layer and the second reflective layer has a thickness of $\frac{1}{2} \pm 10\%$ of a wavelength of light used.

19. The method of claim 16, wherein the first reflective layer has a thickness of $\frac{1}{4} \pm 10\%$ of a wavelength of light used, and the second reflective layer has a thickness of $\frac{1}{4} \pm 10\%$ of the first reflective layer.

20. The method of claim 14, wherein forming the projecting pattern includes selectively etching the substrate.

* * * * *